(12) United States Patent
Omi et al.

(10) Patent No.: US 7,161,198 B2
(45) Date of Patent: Jan. 9, 2007

(54) SEMICONDUCTOR INTEGRATED CIRCUIT DEVICE HAVING MOS TRANSISTOR

(75) Inventors: Toshihiko Omi, Chiba (JP); Hitomi Watanabe, Chiba (JP); Kazutoshi Ishii, Chiba (JP); Naoto Saitoh, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/236,413

(22) Filed: Sep. 6, 2002

(65) Prior Publication Data

US 2003/0049907 A1 Mar. 13, 2003

(30) Foreign Application Priority Data

Oct. 19, 2001 (JP) .............................. 2001-321817

(51) Int. Cl.
H01L 29/76 (2006.01)
(52) U.S. Cl. ............... 257/288; 257/341; 257/E21.537; 257/E29.256; 438/300
(58) Field of Classification Search ................ 257/371, 257/541–551, 285, 288, 341, 350, E21.644, 257/E21.537, E29.256, E29.012, E21.63; 438/506, 916, FOR. 255, 300
See application file for complete search history.

(56) References Cited

U.S. PATENT DOCUMENTS

| | | | | | |
|---|---|---|---|---|---|
| 4,448,400 A | * | 5/1984 | Harari | .................... | 365/185.03 |
| 5,093,707 A | * | 3/1992 | Maeda | ......................... | 257/370 |
| 5,137,838 A | * | 8/1992 | Ramde et al. | .............. | 438/499 |
| 5,144,408 A | * | 9/1992 | Iwasaki | ........................ | 257/557 |
| 5,424,572 A | * | 6/1995 | Solheim | ...................... | 257/370 |
| 5,565,790 A | * | 10/1996 | Lee | .............................. | 326/30 |
| 5,696,004 A | * | 12/1997 | Kanai | .......................... | 438/414 |
| 5,760,448 A | * | 6/1998 | Maeda | ......................... | 257/362 |
| 5,895,251 A | * | 4/1999 | Kim | ............................. | 438/401 |
| 5,953,600 A | * | 9/1999 | Gris | ............................ | 438/200 |
| 5,976,921 A | * | 11/1999 | Maeda | ......................... | 438/202 |
| 5,989,968 A | * | 11/1999 | Kim et al. | ................... | 438/365 |
| 6,352,887 B1 | * | 3/2002 | Hutter et al. | ................ | 438/202 |
| 6,376,870 B1 | * | 4/2002 | Carpenter et al. | .......... | 257/288 |
| 6,451,640 B1 | * | 9/2002 | Ichikawa | ..................... | 438/199 |
| 6,521,923 B1 | * | 2/2003 | D'Anna et al. | ............. | 257/288 |
| 6,611,044 B1 | * | 8/2003 | Pruijmboom et al. | ....... | 257/588 |
| 2001/0045670 A1 | * | 11/2001 | Nojiri | .......................... | 257/786 |
| 2003/0049907 A1 | * | 3/2003 | Omi et al. | ................... | 438/286 |

* cited by examiner

Primary Examiner—Matthew Smith
Assistant Examiner—Khiem D. Nguyen
(74) Attorney, Agent, or Firm—Adams & Wilks

(57) ABSTRACT

An N-channel MOS transistor of a semiconductor device having a high withstand voltage employs a drain structure with a low concentration and a large diffusion depth, which causes a problem in that a sufficiently high withstand voltage cannot be obtained due to a parasitic NPN transistor formed among the drain, the well, and the semiconductor substrate which are arranged in the stated order. According to the present invention, provided are a semiconductor device, including: a semiconductor substrate; an epitaxial layer having an electric polarity identical with that of the semiconductor substrate, which is formed on the semiconductor substrate; a buried diffusion layer having the electric polarity different from that of the semiconductor substrate, which is formed between the semiconductor substrate and the epitaxial layer; and a well region having the electric polarity identical with that of the buried diffusion layer, which is formed above the buried diffusion layer and is electrically connected therewith, in which a MOS transistor is formed in a well having a structure in which the buried diffusion layer is electrically connected with the well region, and a manufacturing method therefor.

30 Claims, 3 Drawing Sheets

SEMICONDUCTOR INTEGRATED CIRCUIT DEVICE HAVING MOS TRANSISTOR

BACKGROUND OF THE INVENTION

1. Field of the Invention

Semiconductor integrated circuit devices having MOS transistors are used widely in electronic equipment such as personal computer, a cellular phone, or a home electric apparatus. In semiconductor devices used for the electronic equipment, a power supply voltage has been decreasing year after year for the semiconductor device used in a signal processing system such as an LSI or a CPU. On the other hand, the power supply voltage of the semiconductor device used for controlling the power supply voltage, a driving system, a peripheral equipment, etc. has not decreased. Therefore, a semiconductor device high in withstand voltage is required. The present invention relates to the semiconductor device integrating the MOS transistor having the high withstand voltage.

2. Description of the Related Art

MOS transistors high in withstand voltage, which are used for the semiconductor device employ an LDD (lightly doped drain), a DDD (double doped drain) structure, a drain structure having a low concentration drift region utilizing a field dope, and the like. These structures make it possible to relax an electric field generated in the vicinity of a drain, so that the withstand voltage of the drain can be increased. However, the above-mentioned MOS transistors each have the low concentration drift region and thus, a parasitic resistance is large and it is impossible to cause a large amount of current to flow therethrough. Also, in a case where excess charges are forcibly caused to flow in a low concentration drain region due to static electricity etc., the region involves such a problem that heat is excessively generated and the current concentratedly flows in a part, so that it is easily subjected to breakdown. In particular, in an N-channel MOS transistor, when the excess charges are applied to the drain, an NPN bipolar transistor is turned ON, which is parasitically formed among the drain, a well, and a source arranged in the stated order. This causes a current of several hundreds of mA or more to flow therethrough, so that the low concentration drain region is easily subjected to breakdown.

Therefore, as shown in FIG. 4, for example, a structure is employed such that the drain region is formed by diffusing an impurity deeply to thereby increase a volume of the low concentration drain region, so that density of the current flowing in the drain is lowered to enhance a resistance to an excess current.

However, in a case where the drain region is formed through the deep diffusion in order to increase a volume of the drain region, a difference is small between diffusion depth of the drain region and that of the well region. Thus, there arises a problem such that the withstand voltage among the drain, the well, and the semiconductor substrate is decreased. In the case of the N-channel MOS transistor, when the semiconductor substrate is a P-type, the well and the semiconductor substrate have the same electric polarity. Thus, there causes no problem regarding the decreased withstand voltage among the drain, the well, and the semiconductor substrate. However, when the semiconductor substrate is an N-type, the NPN bipolar transistor is parasitically formed among the drain, the well, and the semiconductor substrate. At this time, the well region serving as a base of the NPN bipolar transistor is high in resistance and a distance between a lower end of the drain region and the semiconductor substrate, which corresponds to a base width of the NPN bipolar transistor is small. Therefore, the parasitic NPN bipolar transistor is caused to operate at a relatively low voltage and the drain cannot secure a sufficient withstand voltage.

Also, when the semiconductor substrate is an N-type, a state in which a depletion layer formed in a portion below the drain and spread between the drain and the well and a delpletion layer spread between the well and the semiconductor substrate are communicated with each other, i.e., punch-through involves a leak current, which causes the withstand voltage of the drain to decrease. An impurity concentration is low in a portion below the well, so that the depletion layers spread between the drain and the well and between the well and the semiconductor substrate are both expanded up to several microns. Thus, a problem regarding the punch-through is serious.

In order to solve the above-mentioned problem, the following is considerable: the well region is formed such that the diffusion depth thereof is sufficiently larger than that of the drain region. For this purpose, there is provided a method in which a drive-in process for forming the well region is performed at high temperature for a long period of time, a method in which an impurity implantation amount necessary for forming the well region is increased, a method in which ion implantation for implanting the impurity is performed at high energy, or the like. However, these methods involve a problem in terms of production in that productivity is decreased due to an increased process time, a special manufacturing apparatus is required, or the like. In addition, there arises a problem in that the impurity concentration in the surface of the well, which largely affects characteristics of the MOS transistor, becomes high to lower controllability.

SUMMARY OF THE INVENTION

The present invention has been made in view of the above-mentioned problem and an object of the present invention is to provide a semiconductor device capable of solving the above-mentioned problem, and high in withstand voltage and also resistant to an electrostatic discharge damage.

According to the present invention, there are provided a semiconductor device, including: a semiconductor substrate; an epitaxial layer having an electric polarity identical with that of the semiconductor substrate, which is formed on the semiconductor substrate; a buried diffusion layer having the electric polarity different from that of the semiconductor substrate, which is formed between the semiconductor substrate and the epitaxial layer; and a well region having the electric polarity identical with that of the buried diffusion layer, which is formed above the buried diffusion layer and is electrically connected therewith, characterized in that a MOS transistor is formed in a well having a structure in which the well region is electrically connected with the buried diffusion layer, and a manufacturing method therefor.

According to the present invention, the buried diffusion layer is formed below a general well region, which has the same electric polarity as the well region and further, the well region and the buried diffusion layer are connected with each other. This substantially corresponds to a state in which the well region is formed deeply.

Also, the semiconductor device according to the present invention is characterized in that the drain region is formed above the buried diffusion layer; a diffusion region having the same electric polarity as the drain region exists below the drain region; and an impurity concentration of the diffusion region formed below the drain region is lower than that of the drain region, so that if the low concentration drain region diffused deeply which is required for the high withstand MOS transistor is formed, the well region having sufficient depth can remain below the drain region.

Also, the semiconductor device according to the present invention is characterized in that the semiconductor substrate and the epitaxial layer are each an N-type and the buried diffusion layer and the well region are each a P-type, so that the present invention is highly effective for an N-channel MOS transistor that is high in improvement effect.

Also, the semiconductor device according to the present invention is characterized in that an output transistor of the semiconductor device is formed in the well region, and an ESD protection transistor for protecting the semiconductor device from a static electricity is formed in the well region, so that the semiconductor device has a high resistance to the electrostatic discharge damage from an input/output pad.

Also, the semiconductor device according to the present invention is characterized in that the diffusion layer formed below the drain region is formed from the epitaxial layer, so that a special step is required to form the diffusion layer below the drain region.

In the manufacturing method for the semiconductor device according to the present invention, in a structure in which the diffusion layer formed below the drain region is formed from the epitaxial layer, an impurity used for forming the well region is implanted into the well region except for the diffusion layer formed below the drain region, so that the well region and the diffusion layer below the drain region can be formed.

Also, in the semiconductor device according to the present invention, the buried diffusion layer is higher than the well region in an impurity concentration, so that a structure is obtained in which a depletion layer formed between the well region and the semiconductor substrate does not spread toward the well region side and a withstand voltage against punch-through between the drain region and the semiconductor substrate is high. Also, a specific resistance of the buried diffusion layer is low, which makes a resistance of the well region low and thus a parasitic bipolar operation hardly occurs. In addition, there employs a structure in which a source region is formed above the buried diffusion region, so that the withstand voltage against the punch-through between the source region and the semiconductor substrate is also high. Further, the diffusion region having the same electric polarity as the source region exists below the source region and thus, it is possible to allow a drain current to flow from the drain region to the source region and flow in a direction opposite thereto.

Also, according to the present invention, there is provided the semiconductor device, including: a first MOS transistor high in an electric withstand voltage; and a second MOS transistor having the electric withstand voltage lower than that of the first MOS transistor. The second MOS transistor is low in the withstand voltage, so that it is possible to reduce a gate length etc. as compared with the first MOS transistor. Thus, it is directly connected to an output or input terminal and therefore, when the first MOS transistor is used in a circuit for which a high electric withstand voltage is required and the second MOS transistor is used in a circuit for which the high electric withstand voltage is not required, a semiconductor device can be further reduced in size to realize a low cost.

In the manufacturing method for the semiconductor device according to the present invention, an impurity necessary for forming the buried diffusion region is implanted into the semiconductor substrate and then the epitaxial layer is formed in which the well region is formed, so that after formation of the epitaxial layer, a general manufacturing process for the MOS transistor can be employed to produce it.

Therefore, according to the present invention, the problem inherent to the prior art can be solved and the semiconductor device high in withstand voltage and also resistant to the electrostatic discharge damage can be provided.

DETAILED DESCRIPTION OF THE PREFERRED EMBODIMENTS

Hereinafter, a description will be made of embodiments of the present invention.

Figure 1:
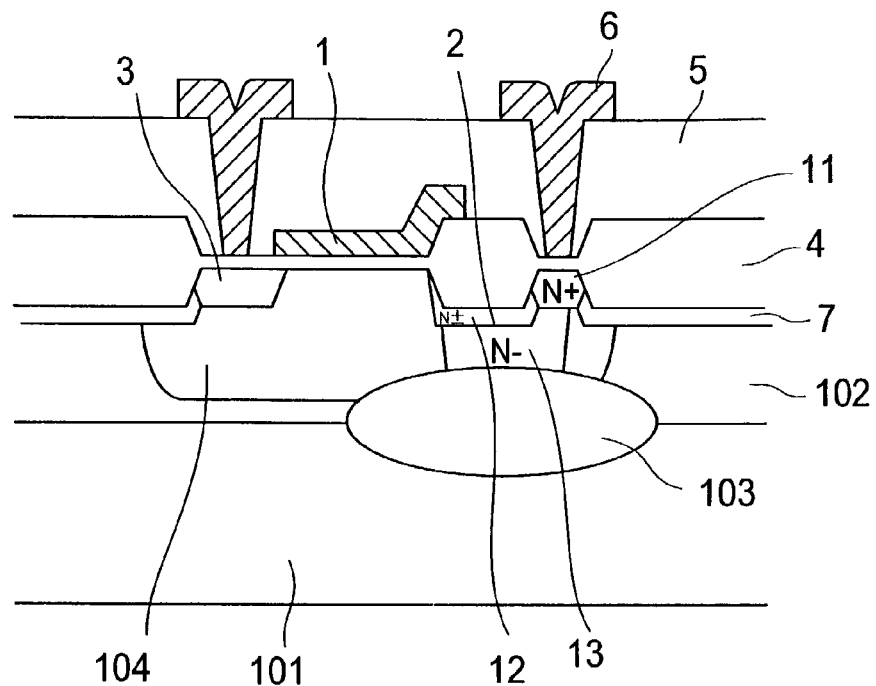
FIG. 1 is a sectional view showing a semiconductor device in accordance with a first embodiment of the present invention.

FIG. 1 is a sectional view showing a MOS transistor in accordance with a first embodiment of the present invention. In this embodiment, an example will be described in which, in an N-channel MOS transistor using an N-type semiconductor substrate, the MOS transistor has a drain structure including a low concentration drift region utilizing a field dope. The MOS transistor experimentally manufactured this time has a specification such that a withstand voltage thereof is 30V.

A semiconductor substrate 101 is an N-type substrate, on which an N-type epitaxial layer 102 is formed. The epitaxial layer 102 has a thickness of 12 μm, in which a P-type well region is formed. The N-channel MOS transistor is formed therein.

A gate 1 of the MOS transistor is formed of a polycrystalline silicon film in which phosphorous is diffused. A drain 2 is formed to include the low concentration drift region utilizing the field dope. Therefore, the polycrystalline silicon film of the gate is partially overlaid on a field oxide film 4. The drift region of the drain 2 consists of an N± region 12 and an N− region 13. The N± region 12 and the N− region 13 are brought in contact with an N+ region 11, through which an electrical contact with an aluminum wiring 6 for the drain is achieved. A source 3 has the same structure as that of a general MOS transistor.

The MOS transistor is designed such that a gate length is 8 μm and a low concentration drift portion of the drain is formed with a length of 4.2 μm.

A buried diffusion layer 103 is formed in a portion below the drain 2 with a thickness of about 10 μm. A well region 104 is 8 μm in depth and is designed so as to be electrically connected to the buried diffusion layer 103. The N-region 13 is about 7 µm in depth, so that it is just in contact with the buried diffusion layer 103.

With this structure, the drain secures a volume enough to obtain a sufficient resistance to static electricity and there is also maintained an interval of 10 µm between a lower portion of the drain and the semiconductor substrate, which makes it possible to secure a sufficient withstand voltage between the drain and the semiconductor substrate.

Next, a description will be made briefly of a manufacturing step. First, boron is implanted in a concentration of $1 \times 10^{14}$ cm$^{-2}$ in order to form the buried diffusion layer 103. Subsequently, phosphorous is doped thereinto to form the epitaxial layer 102. Then, the boron is implanted in a concentration of $5 \times 10^{12}$ cm$^{-2}$ to form the well region 104 and, in order to form the N– region 13, arsenic is implanted in a concentration of $1 \times 10^{13}$ cm$^{-2}$ and is driven therein at 1250° C. At this time, the well region 104, the buried diffusion layer 103, and the N– region 13 are formed through diffusion.

Next, a silicon oxide film and a silicon nitride film are patterned, followed by the implantation of boron in a concentration of $8 \times 10^{13}$ cm$^{-2}$ using a resist as a mask for forming a field dope 7. Also, the phosphorous is implanted in a concentration of $2 \times 10^{12}$ cm$^{-2}$ in order to form the N± region 12. Then, the field oxide film 4 is formed at 1100° C. with a thickness of 11300 Å.

Thereafter, a gate oxide film with a thickness of 950 Å is formed through thermal oxidation to form the polycrystalline silicon film with a thickness of 4000 Å and the phosphorous is implanted into the polycrystalline silicon through predepositon. Then, the polycrystalline silicon film is processed to form the gate 1. Subsequently, in order to form the N+ region 11 of the drain 2 and the source 3, the arsenic is implanted in a concentration of $7 \times 10^{16}$ cm$^{-2}$ to perform annealing at 950° C.

Next, boron phosphorous glass with a thickness of 8000 Å is formed as an intermediate film 5. For achieving an electrical contact with the drain, the source, and the gate, contact holes are formed and then an aluminum film with a thickness of 10,000 Å is formed to be processed into the aluminum wirings, thereby experimentally manufacturing the MOS transistor of FIG. 1. In the MOS transistor thus manufactured, the withstand voltage of the drain is 40 V or more and also the withstand voltage against an electrostatic discharge damage is 4000 V or more. It is confirmed that according to the present invention, an objective semiconductor device can be obtained.

Figure 2:
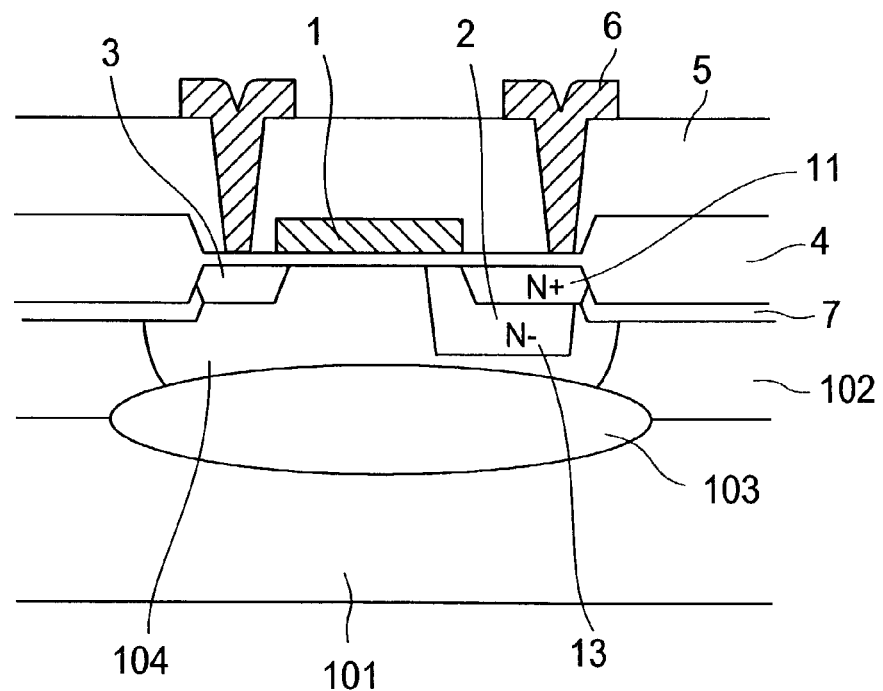
FIG. 2 is a sectional view showing a semiconductor device in accordance with a second embodiment of the present invention.

FIG. 2 is a sectional view showing a MOS transistor in accordance with a second embodiment of the present invention. In this embodiment, an example will be described in which, in the N-channel MOS transistor using the N-type semiconductor substrate, the MOS transistor uses as the drain structure a DDD (double doped drain) structure. The MOS transistor in this embodiment is formed based on a specification such that the withstand voltage thereof is 25V.

The semiconductor substrate 101 is the N-type substrate, on which the N-type epitaxial layer 102 is formed. The epitaxial layer 102 has a thickness of 12 µm, in which the P-type well region is formed. The N-channel MOS transistor is formed therein.

The gate 1 of the MOS transistor is formed of a polycrystalline silicon film in which phosphorous is diffused. The drain 2 consists of the N+ region 11 and N– region 13. Through the N+ region 11, an electrical contact with the aluminum wiring 6 for the drain is achieved. The withstand voltage of the drain 2 on the gate 1 side is determined based on characteristics of the N– region 13. The source 3 has the same structure as that of the general MOS transistor. The MOS transistor is designed to have a gate length of 12 µm.

In this embodiment, the buried diffusion layer 103 is formed below a transistor portion with a thickness of about 10 µm. The well region 104 is 8 µm in depth and is designed so as to be electrically connected to the buried diffusion layer 103. The N-region 13 is about 5 µm in depth.

Next, a description will be made briefly of a manufacturing step. First, boron is implanted in a concentration of $1 \times 10^{14}$ cm$^{-2}$ to form the buried diffusion layer 103. Subsequently, phosphorous is doped thereinto to form the epitaxial layer 102. Then, in order to form the well region 104, the boron is implanted in a concentration of $5 \times 10^{12}$ cm$^{-2}$ and is driven therein at 1250° C. At this time, the well region 104, the buried diffusion layer 103, and N– region 13 are formed through diffusion.

Next, a silicon oxide film and a silicon nitride film are patterned, followed by the implantation of boron in a concentration of $6 \times 10^{13}$ cm$^{-2}$ using a resist as a mask for forming the field dope 7. Then, the field oxide film 4 is formed at 1100° C. with a thickness of 11300 Å.

Subsequently, in order to form the N– region 13, arsenic is implanted in a concentration of $5 \times 10^{14}$ cm$^{-2}$ and is diffused at 1150° C.

Thereafter, the gate oxide film with a thickness of 950 Å is formed through thermal oxidation to form the polycrystalline silicon film with a thickness of 4000 Å and the phosphorous is implanted into the polycrystalline silicon through predepositon. Then, the polycrystalline silicon film is processed to form the gate 1. Subsequently, in order to form the N+ region 11 of the drain 2 and the source 3, the arsenic is implanted in a concentration of $7 \times 10^{15}$ cm$^{-2}$ to perform annealing at 950° C.

Next, the boron phosphorous glass with a thickness of 8000 Å is formed as the intermediate film 5. For achieving an electrical contact with the drain, the source, and the gate, the contact holes are formed and then the aluminum film with a thickness of 10,000 Å is formed to be processed into the aluminum wirings, thereby experimentally manufacturing the MOS transistor of FIG. 2. In the MOS transistor thus manufactured, the withstand voltage of the drain is 30 V or more and also the withstand voltage against the electrostatic discharge damage is 4000 V or more. It is confirmed that according to the present invention, an objective semiconductor device can be obtained.

Figure 3:
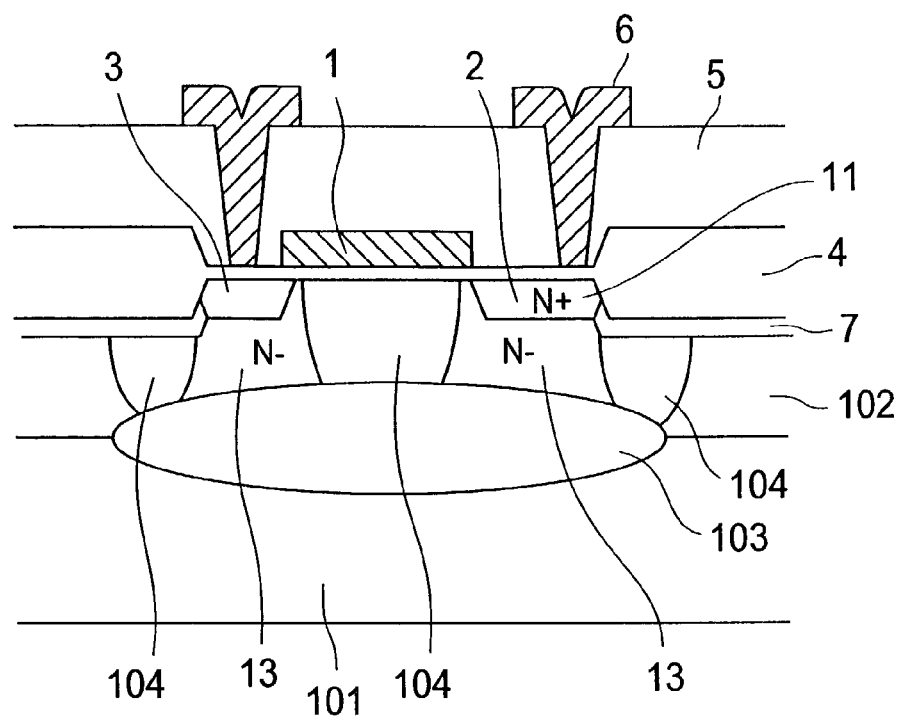
FIG. 3 is a sectional view showing a semiconductor device in accordance with a third embodiment of the present invention.
Figure 4:
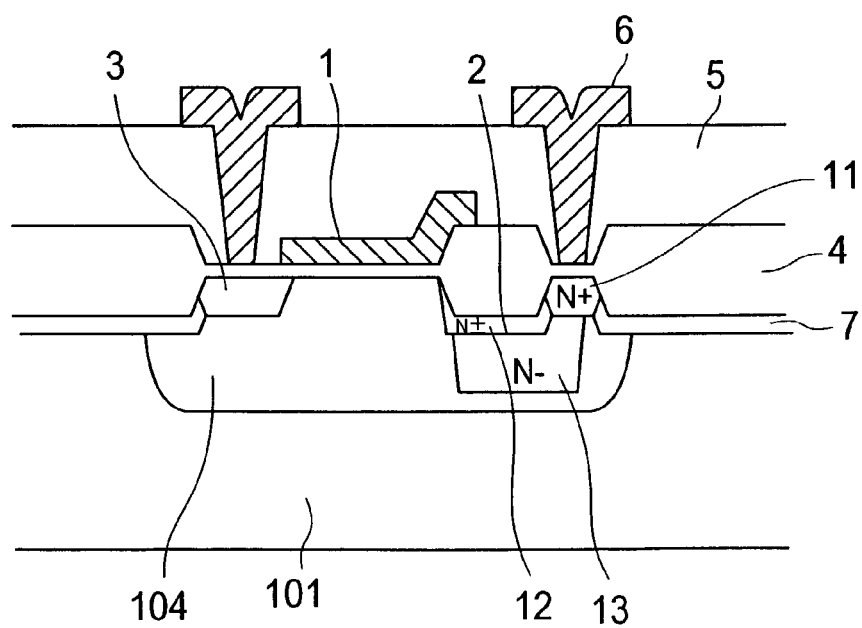
FIG. 4 is a sectional view showing a conventional semiconductor device.

FIG. 3 is a sectional view showing a MOS transistor in accordance with a third embodiment of the present invention. In this embodiment, an example will be described in which, in the N-channel MOS transistor using the N-type semiconductor substrate, the MOS transistor has a drain structure including the low concentration drift region utilizing the field dope. The MOS transistor experimentally manufactured this time has a specification such that the withstand voltage thereof is 30V.

The semiconductor substrate 101 is the N-type substrate, on which the N-type epitaxial layer 102 is formed. The epitaxial layer 102 has a thickness of 12 µm, in which the P-type well regions are formed. The N-channel MOS transistor is formed therein.

The gate 1 of the MOS transistor is formed of a polycrystalline silicon film in which phosphorous is diffused. The drain 2 is formed to include the low concentration drift region utilizing the field dope. Thus, the polycrystalline silicon film of the gate is partially overlaid on the field oxide film 4. The drift region of the drain 2 consists of the N± region 12 and the N– region 13 that is formed of the N-type epitaxial layer 102. The N± region 12 and the N− region 13 are brought in contact with the N+ region 11, through which an electrical contact with the aluminum wiring 6 for the drain is achieved. The source 3 has the same structure as that of the general MOS transistor.

The MOS transistor is designed such that a gate length is 8 μm and the low concentration drift portion of the drain is formed with a length of 4.2 μm. The buried diffusion layer 103 is formed in a portion below the drain 2 with a thickness of about 10 μm. The well region 104 is 8 μm in depth and is designed so as to be electrically connected to the buried diffusion layer 103.

With this structure, the drain secures a volume enough to obtain a sufficient resistance to static electricity and there is also maintained an interval of 10 μm between a lower portion of the drain and the semiconductor substrate, which makes it possible to secure a sufficient withstand voltage between the drain and the semiconductor substrate.

Next, a description will be made briefly of a manufacturing step. First, boron is implanted in a concentration of $1 \times 10^{14}$ cm$^{-2}$ to form the buried diffusion layer 103. Subsequently, phosphorous is doped thereinto to form the epitaxial layer 102. Then, in order to form the well region 104, the boron is implanted in a concentration of $5 \times 10^{12}$ cm$^{-2}$ and is driven therein at 1250° C. At this time, a region serving as the N− region 13 is covered with a mask so as not to implant the boron used for forming the well region 104 thereinto. Thus, the well region 104, the buried diffusion layer 103 and N− region 13 are formed through diffusion.

Next, a silicon oxide film and a silicon nitride film are patterned, followed by the implantation of boron in a concentration of $8 \times 10^{13}$ cm$^{-2}$ using a resist as a mask for forming the field dope 7. Also, the phosphorous is implanted in a concentration of $2 \times 10^{12}$ cm$^{-2}$ to form the N± region 12. Then, the field oxide film 4 is formed at 1100° C. with a thickness of 11300 Å.

Thereafter, the gate oxide film with a thickness of 950 Å is formed through thermal oxidation to form the polycrystalline silicon film with a thickness of 4000 Å and the phosphorous is implanted into the polycrystalline silicon through predepositon. Then, the polycrystalline silicon film is processed to form the gate 1. Subsequently, in order to form the N+ region 11 of the drain 2 and the source 3, the arsenic is implanted in a concentration of $7 \times 10^{15}$ cm$^{-2}$ to perform annealing at 950° C.

Next, the boron phosphorous glass with a thickness of 8000 Å is formed as the intermediate film 5. For achieving an electrical contact with the drain, the source, and the gate, the contact holes are formed and then the aluminum film with a thickness of 10,000 Å is formed to be processed into the aluminum wirings, thereby experimentally manufacturing the MOS transistor of FIG. 3. In the MOS transistor thus manufactured, the withstand voltage of the drain is 40 V or more and also the withstand voltage against the electrostatic discharge damage is 4000 V or more. It is confirmed that according to the present invention, a desired semiconductor device can be obtained.

Figure 5:
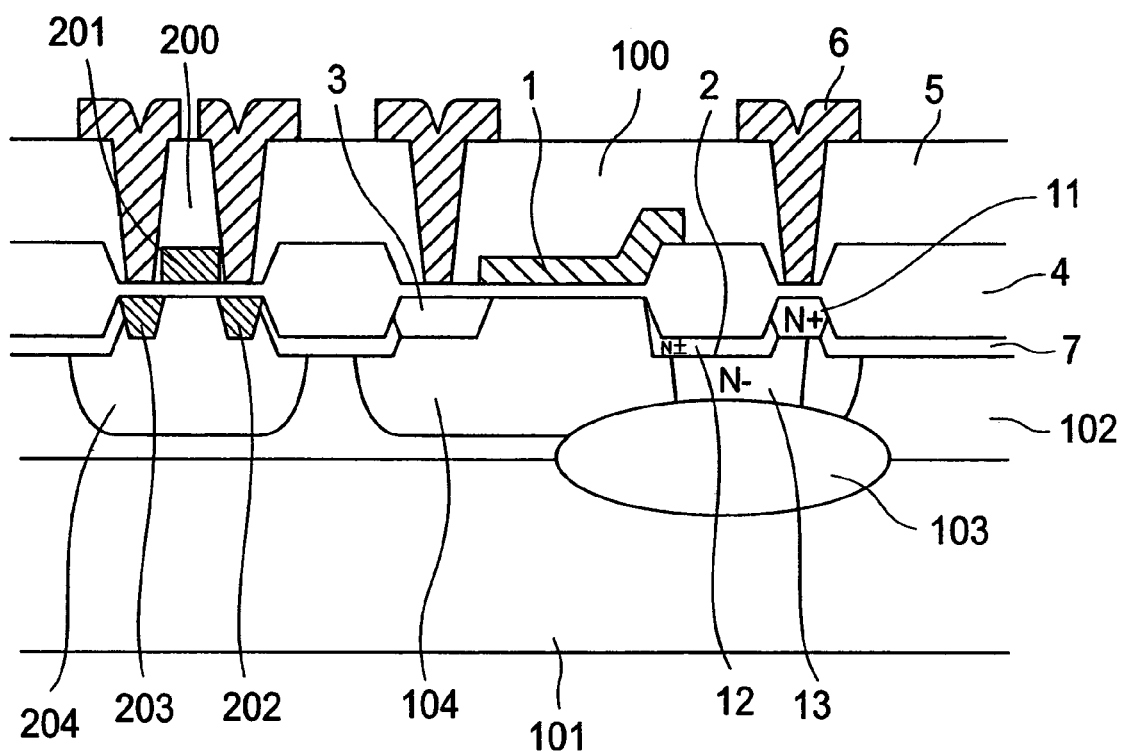
FIG. 5 is a sectional view showing a semiconductor device in accordance with a fourth embodiment of the present invention.

FIG. 5 is a sectional view showing a MOS transistor in accordance with a fourth embodiment of the present invention. In this embodiment, an example will be described in which, in the N-channel MOS transistor using the N-type semiconductor substrate, the MOS transistor has the drain structure including the low concentration drift region utilizing the field dope. As a specification for the MOS transistors experimentally manufactured this time, the withstand voltages of a first MOS transistor and a second MOS transistor are 30V and 10V, respectively.

The semiconductor substrate 101 is the N-type substrate, on which the N-type epitaxial layer 102 is formed. The epitaxial layer 102 has a thickness of 12 μm, in which the P-type well region is formed. The N-channel MOS transistor is formed therein.

The gate 1 of the first MOS transistor is formed of the polycrystalline silicon film in which the phosphorous is diffused. The drain 2 is formed to include the low concentration drift region utilizing the field dope. Therefore, the polycrystalline silicon film of the gate is partially overlaid on the field oxide film 4. The drift region of the drain 2 consists of the N± region 12 and the N− region 13. The N± region 12 and the N− region 13 are brought in contact with the N+ region 11, through which an electrical contact with the aluminum wiring 6 for the drain is achieved. The source 3 has the same structure as that of the general MOS transistor.

The first MOS transistor is designed such that a gate length is 8 μm and the low concentration drift portion of the drain is formed with a length of 4.2 μm. The buried diffusion layer 103 is formed in a portion below the drain 2 with a thickness of about 10 μm. The well region 104 is 8 μm in depth and is designed so as to be electrically connected to the buried diffusion layer 103. The N-region 13 is about 7 μm in depth, so that it is just in contact with the buried diffusion layer 103.

With this structure, the drain secures a volume enough to obtain a sufficient resistance to static electricity and there is also maintained an interval of 10 μm between a lower portion of the drain and the semiconductor substrate, which makes it possible to secure a sufficient withstand voltage between the drain and the semiconductor substrate.

Also, a gate 201 of the second MOS transistor is formed of the polycrystalline silicon film in which the phosphorous is diffused. A drain 202 and a source 203 have the same structures as those of the general MOS transistor. The second MOS transistor has a gate length of 1.6 μm and thus can be made smaller as compared with the first MOS transistor.

Next, a description will be made briefly of a manufacturing step. First, boron is implanted in a concentration of $1 \times 10^{14}$ cm$^{-2}$ in order to form the buried diffusion layer 103. Subsequently, phosphorous is doped thereinto to form the epitaxial layer 102. Then, the boron is implanted in a concentration of $5 \times 10^{12}$ cm$^{-2}$ to form the well region 104 and a well region 204, and in order to form the N− region 13, arsenic is implanted in a concentration of $1 \times 10^{13}$ cm$^{-2}$ and is driven therein at 1250° C. At this time, the well regions 104 and 204, the buried diffusion layer 103, and the N− region 13 are formed through diffusion.

Next, a silicon oxide film and a silicon nitride film are patterned, followed by the implantation of boron in a concentration of $8 \times 10^{13}$ cm$^{-2}$ using a resist as a mask for forming the field dope 7. Also, the phosphorous is implanted in a concentration of $2 \times 10^{19}$ cm$^{-2}$ in order to form the N± region 12. Then, the field oxide film 4 is formed at 1100° C. with a thickness of 11300 Å.

Thereafter, the gate oxide films with thicknesses of 950 Å and 300 Å are respectively formed for the first and the second MOS transistors through thermal oxidation to form the polycrystalline silicon film with a thickness of 4000 Å and the phosphorous is implanted into the polycrystalline silicon through predepositon. Then, the polycrystalline silicon film is processed to form the gates 1 and 201. Subsequently, in order to form the N+ region 11 of the drain 2 and the source 3 of the first MOS transistor, and the drain 202 and the source 203 of the second MOS transistor, the arsenic is implanted in a concentration of $7\times10^{15}$ cm$^{-2}$ to perform annealing at 950° C.

Next, the boron phosphorous glass with a thickness of 8000 Å is formed as the intermediate film 5. For achieving an electrical contact with the drains, the sources, and the gates, the contact holes are formed and then an aluminum film with a thickness of 10,000 Å is formed to be processed into the aluminum wirings, thereby experimentally manufacturing the MOS transistors of FIG. 5. In the first MOS transistor thus manufactured, the withstand voltage of the drain is 40 V or more and also the withstand voltage against the electrostatic discharge damage is 4000 V or more. In the second MOS transistor thus manufactured, the withstand voltage of the drain is 15 V and also the withstand voltage against the electrostatic discharge damage is 4000 V or more. It is confirmed that according to the present invention, a desired semiconductor device can be obtained.

According to the present invention, while the general step of manufacturing the MOS transistor is used, a substantially deep well region can be formed, whereby it is possible to form a low concentration drain with a large volume and to form the MOS transistor having a high withstand voltage and high resistance to the static electricity.

What is claimed is:

1. A semiconductor device comprising: a semiconductor substrate; an epitaxial layer formed on the semiconductor substrate; a well region formed under a surface of the epitaxial layer; a field oxide film formed on the well region; a MOS transistor formed in the well region and having a source region, a gate region disposed adjacent the field oxide film, a first drain drift region disposed under the field oxide film, and a second drain drift region disposed under the first drain drift region; and a buried diffusion layer disposed in direct contact with the well region and formed between the semiconductor substrate and the epitaxial layer, the buried diffusion layer being disposed directly under the second drain drift region but not under the source region of the MOS transistor; wherein the semiconductor substrate and the epitaxial layer have a first conductivity type, the buried diffusion layer and the well region have a second conductivity type, and the second drain drift region has the same conductivity type as but a lower impurity concentration than the first drain drift region.

2. A semiconductor device according to claim 1; wherein the MOS transistor is an output transistor of an integrated circuit device.

3. A semiconductor device according to claim 2; wherein the MOS transistor is an ESD protection transistor for protecting from static electricity.

4. A semiconductor device according to claim 1; wherein an impurity concentration of the buried diffusion layer is higher than that of the well region.

5. A semiconductor device according to claim 1; wherein the first conductivity type is N-type and the second conductivity type is P-type.

6. A semiconductor device according to claim 1; wherein a gate oxide film of the MOS transistor is thicker proximate the first drain drift region than the source region.

7. A semiconductor device according to claim 1; wherein the field oxide film is provided between a gate electrode of the MOS transistor and the first drain drift region.

8. A semiconductor device according to claim 1; wherein the epitaxial layer has a thickness of 12 µm and the buried diffusion layer has a thickness of about 10 µm.

9. A semiconductor device according to claim 8; wherein the second drain drift region has a thickness of about 7 µm and comes into direct contact with the buried diffusion layer.

10. A semiconductor device according to claim 1; wherein a spacing of about 10 µm exists between a lower portion of the first drain drift region and the semiconductor substrate.

11. A semiconductor device according to claim 1; wherein the second drain drift region is formed in the epitaxial layer.

12. A semiconductor device according to claim 1; wherein an impurity concentration of the buried diffusion layer is higher than that of the well region.

13. A semiconductor device according to claim 1; further comprising a low concentration source diffusion region formed directly below the source region.

14. A semiconductor device according to claim 13; wherein the low concentration source diffusion region is formed in the epitaxial layer.

15. A semiconductor device according to claim 1; wherein the well region is disposed in overlapping relation to the buried diffusion layer in a thickness direction of the semiconductor device.

16. A semiconductor device according to claim 1; wherein the first drain drift region and the second drain drift region have the second conductivity type.

17. A semiconductor device according to claim 16; wherein the buried diffusion layer has an overall dimension smaller than that of the well region.

18. A semiconductor device comprising: a semiconductor substrate; an epitaxial layer formed on the semiconductor substrate and having the same conductivity type as that of the semiconductor substrate; a well region formed under a surface of the epitaxial layer; a field oxide film formed on the well region; a MOS transistor formed in the well region and having a gate region formed adjacent to the field oxide film, a first drain drift region disposed under the field oxide film, and a second drain drift region disposed under the first drain drift region; and a buried diffusion layer disposed in direct contact with the well region and formed between the semiconductor substrate and the epitaxial layer, the buried diffusion layer having a different conductivity type from that of the semiconductor substrate and having the same polarity as that of the well region, the buried diffusion layer being disposed directly under the second drain drift region but not under the source region of the MOS transistor.

19. A semiconductor device according to claim 18; wherein the MOS transistor is an output transistor of an integrated circuit device or an ESD protection transistor for protecting the integrated circuit device from static electricity.

20. A semiconductor device according to claim 18; wherein an impurity concentration of the buried diffusion layer is higher than that of the well region.

21. A semiconductor device according to claim 18; wherein the semiconductor substrate and the epitaxial layer have an N conductivity type and the buried diffusion layer and the well region have a P conductivity type.

22. A semiconductor device according to claim 18; wherein the well region is disposed in overlapping relation to the buried diffusion layer in a thickness direction of the semiconductor device.

23. A semiconductor device according to claim 18; wherein the buried diffusion layer, the well region, the first drain drift region and the second drain drift region have the same conductivity type.

24. A semiconductor device according to claim 23; wherein the buried diffusion layer has an overall dimension smaller than that of the well region.

25. A semiconductor device comprising: a semiconductor substrate; an epitaxial layer formed on the semiconductor substrate and having the same conductivity type as that of the semiconductor substrate; a first well region formed under a surface of the epitaxial layer; a field oxide film formed on the first well region; a second well region formed in the epitaxial layer; a first MOS transistor formed in the first well region and having a source region, a gate region formed adjacent to the field oxide film, a first drain drift region disposed under the field oxide film, and a second drain drift region disposed under the first drain drift region; a buried diffusion layer disposed in direct contact with the first well region and formed between the semiconductor substrate and the epitaxial layer, the buried diffusion layer being disposed directly under the second drain drift region but not under the source region of the first MOS transistor; and a second MOS transistor formed in the second well region and having a breakdown voltage lower than that of the first MOS transistor, a source region, a gate region, a first drain drift region, and a second drain drift region disposed under the first drain drift region of the second MOS transistor and being electrically connected thereto.

26. A semiconductor device according to claim 25; wherein the first well region is disposed in overlapping relation to the buried diffusion layer in a thickness direction of the semiconductor device.

27. A semiconductor device comprising: a semiconductor substrate; an epitaxial layer formed on the semiconductor substrate; a well region formed under a surface of the epitaxial layer; a field oxide film formed on the well region; a MOS transistor formed in the well region and having a source region, a gate region disposed adjacent the field oxide film, a first drain drift region disposed under the field oxide film, and a second drain drift region disposed under the first drain drift region; and a buried diffusion layer disposed in direct contact with the well region and formed between the semiconductor substrate and the epitaxial layer, the buried diffusion layer being disposed directly under the second drain drift region of the MOS transistor for preventing the occurrence of a punch-through in at least one of the semiconductor substrate and the epitaxial layer.

28. A semiconductor device according to claim 27; wherein the well region is disposed in overlapping relation to the buried diffusion layer in a thickness direction of the semiconductor device.

29. A semiconductor device according to claim 27; wherein the buried diffusion layer, the well region, the first drain drift region and the second drain drift region have the same conductivity type.

30. A semiconductor device according to claim 29; wherein the buried diffusion layer has an overall dimension smaller than that of the well region.

* * * * *